United States Patent
Hirayama

Patent Number: 5,835,434
Date of Patent: *Nov. 10, 1998

[54] INTERNAL VOLTAGE GENERATING CIRCUIT, SEMICONDUCTOR MEMORY DEVICE, AND METHOD OF MEASURING CURRENT CONSUMPTION, CAPABLE OF MEASURING CURRENT CONSUMPTION WITHOUT CUTTING WIRE

[75] Inventor: Kazutoshi Hirayama, Hyogo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 587,684

[22] Filed: Jan. 17, 1996

[30] Foreign Application Priority Data

Jan. 23, 1995 [JP] Japan .................................. 7-008426

[51] Int. Cl.$^6$ ...................................................... G11C 5/14
[52] U.S. Cl. .................... 365/226; 365/189.09; 327/534; 327/536
[58] Field of Search .................................. 365/226, 201, 365/189.09; 327/530, 534, 538, 536

[56] References Cited

U.S. PATENT DOCUMENTS

| | | | |
|---|---|---|---|
| 5,034,625 | 7/1991 | Min | 327/536 |
| 5,249,155 | 9/1993 | Arimoto et al. | 365/222 |
| 5,295,112 | 3/1994 | Taniguchi | 365/226 |
| 5,315,166 | 5/1994 | Arimoto | 327/537 |
| 5,396,114 | 3/1995 | Lee | 327/535 |

FOREIGN PATENT DOCUMENTS 3-217915 A   9/1991   Japan .

OTHER PUBLICATIONS

German Patent Office Action dated Jul. 17, 1997 and English translation thereof.

Primary Examiner—Son Mai
Attorney, Agent, or Firm—Lowe, Price, LeBlanc & Becker

[57] ABSTRACT

This substrate voltage generating circuit (internal voltage generating circuit) includes an oscillator, a p channel transistor, an AND circuit, and a pump circuit. The substrate voltage generating circuit is stopped by applying stop signals S and $\overline{S}$ to the p channel transistor and the AND circuit connected to the oscillator, and by cutting supply of power supply voltage to the oscillator and a path of output of the oscillator. In order to find current consumption at stand-by of a semiconductor memory device, current consumptions of the whole semiconductor memory device at stand-by before and after operation of the substrate voltage generating circuit is stopped as described above are measured, and the difference between them is calculated. Current consumption of the substrate voltage generating circuit is thus found. As described above, the internal voltage generating circuit can be stopped without cutting a wire, thereby allowing measurement of current consumption of the internal voltage generating circuit at stand-by of the semiconductor memory device. As a result, a problem caused by cutting of the wire can be prevented.

13 Claims, 9 Drawing Sheets

INTERNAL VOLTAGE GENERATING CIRCUIT, SEMICONDUCTOR MEMORY DEVICE, AND METHOD OF MEASURING CURRENT CONSUMPTION, CAPABLE OF MEASURING CURRENT CONSUMPTION WITHOUT CUTTING WIRE

BACKGROUND OF THE INVENTION

1. Field of the Invention

The present invention generally relates to an internal voltage generating circuit, a semiconductor memory device, and a method of measuring current consumption, and more particularly, to an internal voltage generating circuit, a semiconductor memory device, and a method of measuring current consumption, which can measure current consumption of the internal voltage generating circuit at stand-by of the semiconductor memory device by stopping the internal voltage generating circuit without cutting a wire.

2. Description of the Background Art

A semiconductor memory device such as a dynamic random access memory includes a plurality of internal voltage generating circuits each for generating a predetermined voltage internally.

Figure 7:
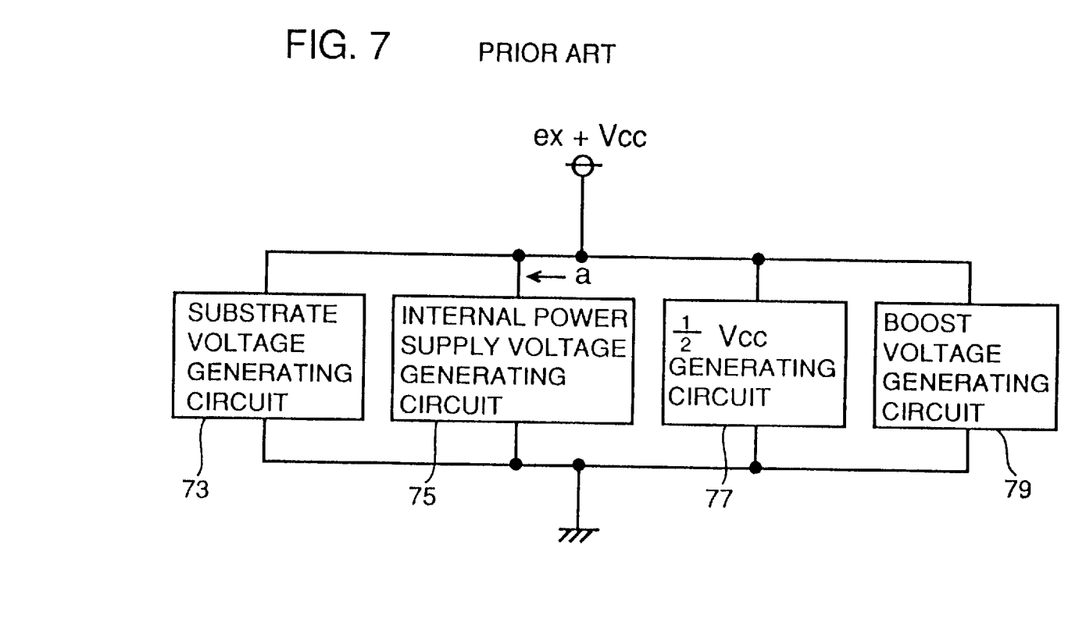
FIG. 7 is a schematic block diagram showing a general internal voltage generating portion of a semiconductor memory device.

FIG. 7 is a schematic block diagram showing a general internal voltage generating portion of the semiconductor memory device.

Referring to FIG. 7, the internal voltage generating portion of the semiconductor memory device includes a substrate voltage generating circuit 73, an internal power supply voltage generating circuit 75, a ½ $V_{CC}$ generating circuit 77, and a boost voltage generating circuit 79 connected in parallel between an external power supply potential and a ground potential. Arrow a will be described later.

Substrate voltage generating circuit 73 generates a negative voltage to be applied to a p type silicon substrate or the like of the semiconductor memory device.

Figure 8:
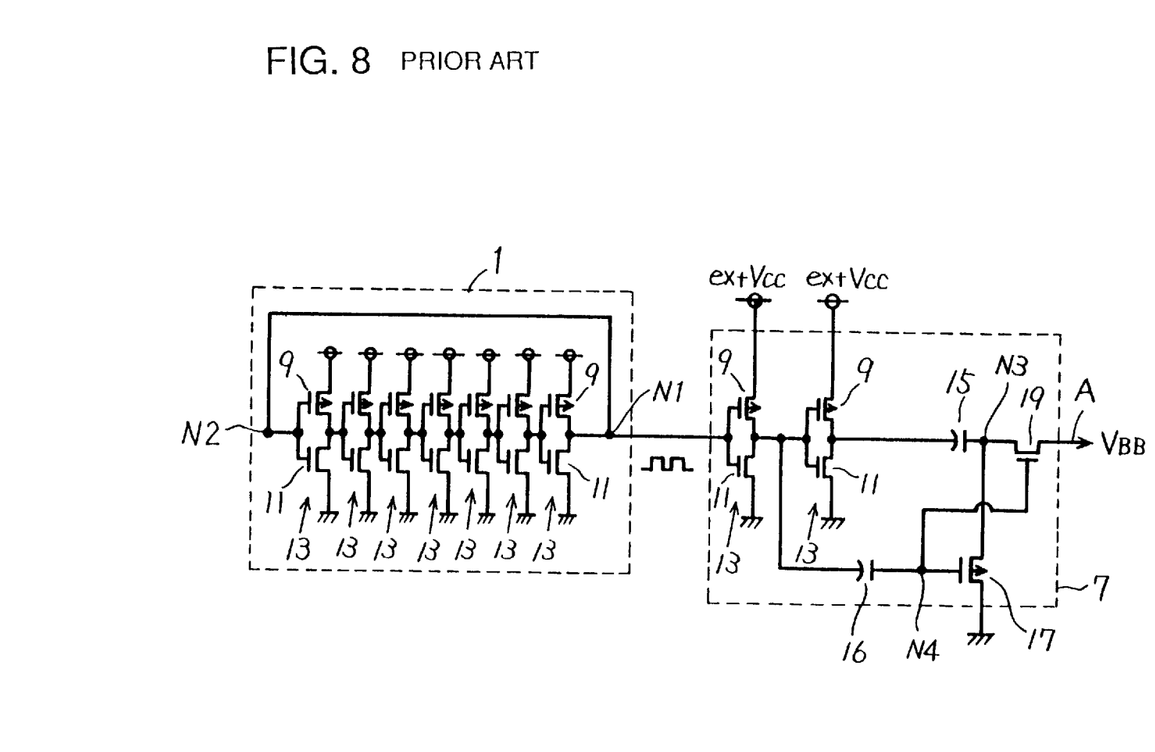
FIG. 8 is a circuit diagram showing the detail of a conventional substrate voltage generating circuit.

FIG. 8 is a circuit diagram showing the details of a conventional substrate voltage generating circuit.

Referring to FIG. 8, the substrate voltage generating circuit includes an oscillator 1 and a pump circuit 7. Oscillator 1 includes seven inverters 13 each formed of a p channel transistor 9 and an n channel transistor 11. Inverters 13 are connected in series. Note that any number of inverters 13 may be provided as long as the number is odd.

An output node N1 of oscillator 1 is connected to pump circuit 7 as well as to an input node N2. Inverters 13 are connected in an odd number of stages. Therefore, when a signal at a logical high or H level is input to oscillator 1 from input node N2, an output from output node N1 attains a logical low or L level. Further, since output node N1 and input node N2 are connected, it results in input of a signal at the L level to oscillator 1, whereby a signal at the H level is provided to output node N1. Oscillator 1 repeats the above operation to input a pulse signal to pump circuit 7.

Pump circuit 7 includes two inverters 13, capacitors 15 and 16, a p channel transistor 17, and an n channel transistor 19.

Voltages at a node N3 and a point A are 0 V at first. When a signal at the L level is input to pump circuit 7 from oscillator 1, node N3 is caused to attain a negative level by capacitor 15. At this time, a node N4 is caused to attain the H level by capacitor 16. Therefore, n channel transistor 19 is turned on, and electrons are supplied to a substrate, not shown. More specifically, the potential at the point A becomes negative slightly.

When a signal at the H level is input to pump circuit 7 from oscillator 1, node N3 is caused to attain the H level by capacitor 15. Since node N4 is at the L level at this time, p channel transistor 17 is turned on, and node N3 attains a GND level. Note that n channel transistor 19 is turned off, and that the potential at the point A is maintained at the negative level. The above operation is repeated, whereby the potential at the point A gradually approaches a negative value to its final target value, that is, a negative voltage $V_{BB}$.

Then, internal power supply voltage generating circuit 75 of FIG. 7 generates a voltage to be applied to an internal circuit such as a sense amplifier, not shown, by down-converting an external power supply voltage.

The ½ $V_{CC}$ generating circuit 77 of FIG. 7 generates a voltage one-half the external power supply voltage (extVcc) (½ $V_{CC}$) or a voltage one-half an internal supply voltage (intVcc) to be applied to a bit line and a cell plate of a memory cell, not shown, of the semiconductor memory device.

Figure 9:
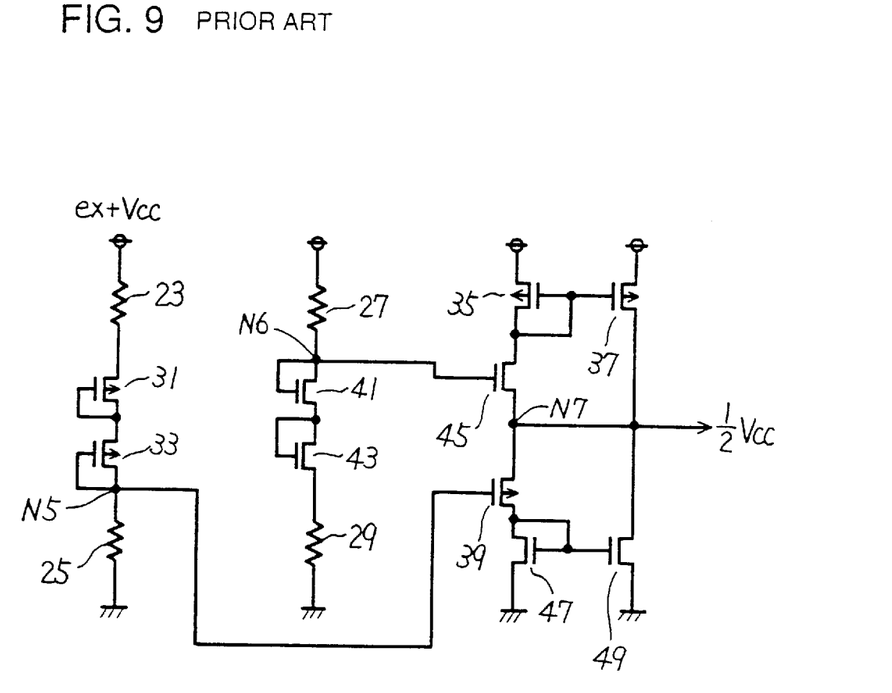
FIG. 9 is a circuit diagram showing the detail of a conventional ½ $V_{CC}$ generating circuit.

FIG. 9 is a circuit diagram showing the details of a conventional ½ $V_{CC}$ generating circuit.

Referring to FIG. 9, the ½ $V_{CC}$ generating circuit includes resistors 23, 25, 27, and 29, p channel transistors 31, 33, 35, 37, and 39, and n channel transistors 41, 43, 45, 47, and 49.

Since p channel transistors 31 and 33 are diode-connected, and resistors 23 and 25 have the same value, the voltage of a node N5 is a voltage one-half the external power supply voltage extVcc (½ $V_{CC}$) minus the threshold voltage of the p channel transistor.

Further, since n channel transistors 41 and 43 are diode-connected, and resistors 27 and 29 have the same value, the voltage of an node N6 is ½ $V_{CC}$ plus the threshold voltage of the n channel transistor.

Therefore, when the voltage of an output node N7 exceeds ½ $V_{CC}$, p channel transistor 39 and n channel transistors 47 and 49 are turned on, and discharge until the voltage of node N7 becomes ½ $V_{CC}$.

When the voltage of output node N7 is lower than ½ $V_{CC}$, n channel transistor 45 and p channel transistors 35 and 37 are turned on, and supply voltage until the voltage of node N7 becomes ½ $V_{CC}$.

As a result, the voltage of output node N7 is always kept at ½ $V_{CC}$, and the ½ $V_{CC}$ generating circuit supplies ½ $V_{CC}$ to a cell plate or the like.

Note that when the voltage one-half the internal power supply voltage (intVcc) is generated, resistors 23 and 27, and the drains of p channel transistors 35 and 37 are connected to the node of the internal power supply voltage.

Further, boost voltage generating circuit 79 of FIG. 7 generates voltage to be applied to a word line or the like, not shown, at the time of reading and writing of data by boosting the external power supply voltage.

Usually, it is necessary to operate these internal voltage generating circuits even at stand-by of a semiconductor memory device for operation of the semiconductor memory device. Therefore, the internal voltage generating circuits consume current even at stand-by.

Figure 10:
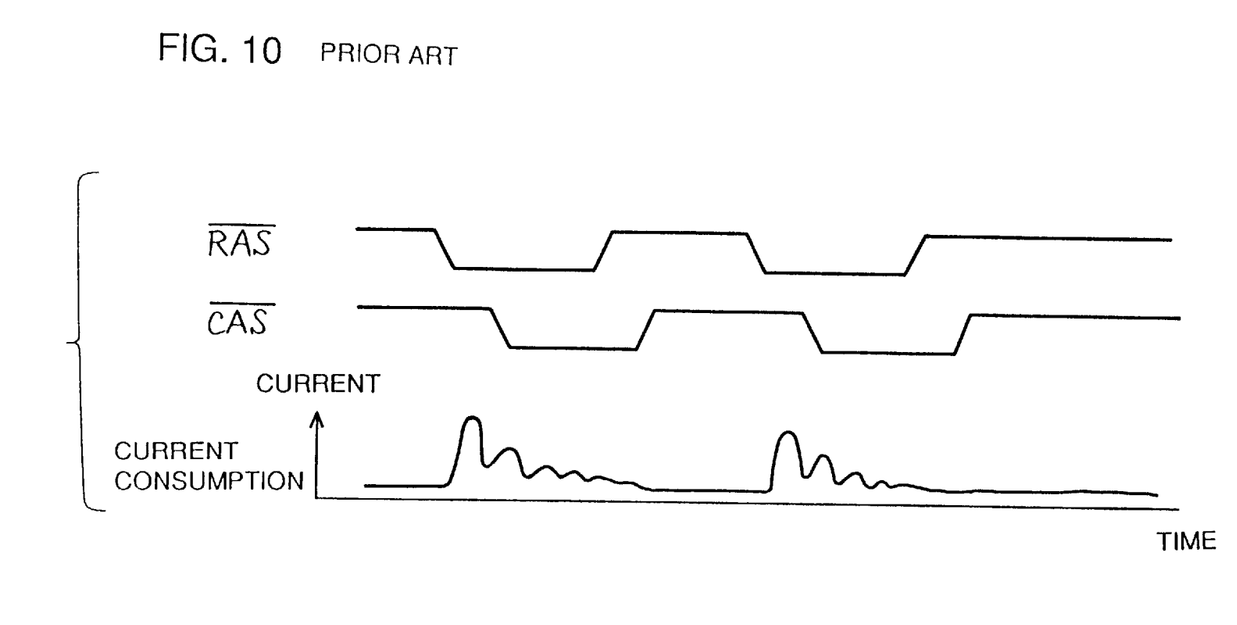
FIG. 10 is a diagram showing the relationship between current consumption of the general semiconductor memory device and time.

FIG. 10 shows the relationship between current consumption of the semiconductor memory device and time.

The upper portion of FIG. 10 shows a waveform of a row address strobe signal $\overline{RAS}$ managing a row related operation. The middle portion of FIG. 10 shows a waveform of a column address strobe signal $\overline{CAS}$ managing a column related operation. The lower portion of FIG. 10 shows the relationship between current consumption of the semiconductor memory device and time. The time is plotted along the abscissa, and the current is plotted along the ordinate.

When the signal $\overline{RAS}$ or $\overline{CAS}$ falls as shown in the upper and middle portions of FIG. 10, arid the semiconductor memory device operates, the current consumption becomes larger as shown in the lower portion of FIG. 10. Further, even when the signals $\overline{RAS}$ and $\overline{CAS}$ rise, and the semiconductor memory device is in a stand-by state, there is a current flow of several $\mu$A to several hundred $\mu$A as shown in the lower portion of FIG. 10.

This current is consumed by the plurality of internal voltage generating circuits such as substrate voltage generating circuit 73 shown in FIG. 7. Therefore, a specification of a current value to be consumed at stand-by of the semiconductor memory device is defined. The smaller the amount of current to be consumed at stand-by of the semiconductor memory device, the larger demand for the semiconductor memory device. Further, it is important to know how much current is consumed by each internal voltage generating circuit when a large amount of current is consumed at stand-by of the semiconductor memory device, in order to know whether the large current consumption is due to the internal voltage generating circuit or a defect in the manufacturing process.

When there is no short or the like between a bit line and a GND line or a power supply line caused by a foreign particle or the like, the semiconductor memory device at stand-by consumes current only before the semiconductor memory device settles down in a steady state after power-on or only before the semiconductor memory device returns variation in voltage caused by capacitive coupling of the bit line and a cell node to the steady state, except for ordinary consumption current by the internal voltage generating circuit. However, when there is a short or the like between the bit line and the power supply line or the GND line caused by a foreign particle or the like, and the voltage of the bit line or the like is too high or too low, the semiconductor memory device generates a current path in a steady manner, and consumes more current at stand-by than an ordinary product (semiconductor memory device).

This increase in current consumption is sometimes caused by current consumed by the $\frac{1}{2} V_{CC}$ generating circuit in particular. Therefore, it is necessary to confirm current consumption of the $\frac{1}{2} V_{CC}$ generating circuit.

As described above, in order to analyze factors of current consumed at stand-by of the semiconductor memory device, it is important to know how much current is consumed by the plurality of internal voltage generating circuits, respectively, at the time of development, improvement, and manufacture of the semiconductor memory device.

Figure 11:
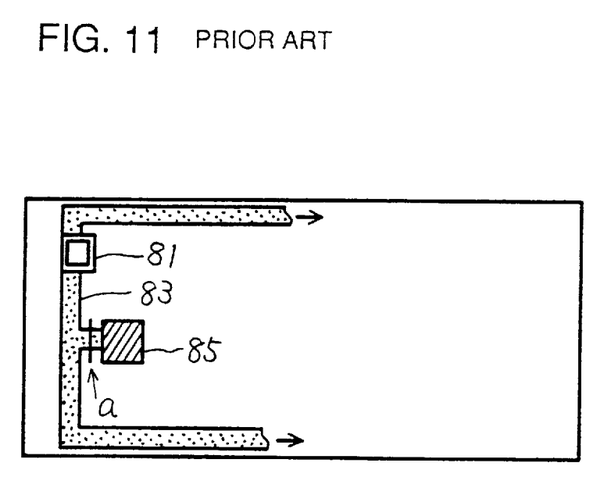
FIG. 11 s a schematic diagram showing a peripheral portion of a semiconductor memory device for explaining a conventional method of measuring current consumption of an internal voltage generating circuit at stand-by of a semiconductor memory device.

FIG. 11 schematically shows a peripheral portion of the semiconductor memory device in order to explain a conventional method of measuring current consumption of the internal voltage generating circuit at stand-by of the semiconductor memory device.

Referring to FIG. 11, the external power supply voltage is supplied to an internal voltage generating circuit 85 and other circuits from an external power supply pad 81 via an aluminum wire 83.

The conventional method of measuring current consumption of internal voltage generating circuit 85 at stand-by of the semiconductor memory device will be described.

At first, current consumption of the whole semiconductor memory device at stand-by is measured. Then, after physically cutting aluminum wire 83 as shown by arrow a using an FIB (Focused Ion Beam) or a laser cutter (after breaking a path of supplying voltage to internal voltage generating circuit 85), the entire current consumption at stand-by of the semiconductor memory device is measured. Then, the difference between current consumption before and after the aluminum wire is broken is calculated. This difference indicates current consumption of internal voltage generating circuit 85.

Although the semiconductor memory device shown in FIG. 11 includes only one internal voltage generating circuit 85, the semiconductor memory device actually includes a plurality of internal voltage generating circuits as shown in FIG. 7. When it is desired to measure current consumption of internal power supply voltage generating circuit 75 in FIG. 7, the entire current consumption at stand-by of the semiconductor memory device is first measured. Then, a power supply line indicated by arrow a of FIG. 7 is cut, and the entire current consumption is again measured. The difference between current consumption before and after the power supply line is cut at arrow a is calculated. This difference indicates current consumption of internal power supply voltage generating circuit 75 at stand-by.

As described above, conventionally, when the internal voltage generating circuit such as the substrate voltage generating circuit or the $\frac{1}{2} V_{CC}$ generating circuit is stopped in order to measure current consumption of the internal voltage generating circuit of the semiconductor memory device at stand-by, the aluminum wire for supplying a power supply voltage to each internal voltage generating circuit is cut. This causes the substrate to be damaged or the cut wire to be shorted to an adjacent wire, hampering measurement of the internal voltage generating circuit at stand-by of the semiconductor memory device.

Further, cutting the wire necessitates a new semiconductor memory device for every measurement, making it impossible to grasp characteristics of the semiconductor memory device precisely. More specifically, it is not possible to measure current consumption of each of the plurality of internal voltage generating circuits at stand-by of the semiconductor memory device using the same semiconductor memory device.

In addition, the characteristics of the semiconductor memory device other than current consumption of the internal voltage generating circuit cannot be checked using the same semiconductor memory device, making it impossible to grasp the characteristics of the semiconductor memory device consistently. Further, changing a semiconductor memory device for every measurement of current consumption increases cost for grasping the characteristics of the semiconductor memory device such as current consumption of the internal voltage generating circuits.

SUMMARY OF THE INVENTION

One object of the present invention is to provide an internal voltage generating circuit which can be stopped without cutting a wire.

Another object of the present invention is to provide a semiconductor memory device which can measure current consumption of an internal voltage generating circuit at stand-by of the semiconductor memory device by stopping the internal voltage generating circuit without cutting a wire.

Still another object of the present invention is to provide a method of measuring current consumption capable of measuring current consumption of an internal voltage generating circuit at stand-by of a semiconductor memory device by stopping the internal voltage generating circuit without cutting a wire.

According to one aspect of the present invention, an internal voltage generating circuit includes an internal voltage generating portion which is in an operating state even at stand-by of a semiconductor memory device, and a first stopping circuit stopping operation of the internal voltage generating portion in response to a predetermined signal.

As described above, without cutting a wire supplying current to the internal voltage generating portion, the operation of the internal voltage generating portion can be stopped electrically by the predetermined signal.

When the operation of the internal voltage generating portion is stopped by cutting the wire supplying current to the internal voltage generating portion, a substrate is damaged, and the cut wire is shorted to an adjacent wire, hampering measurement of current consumption of the internal voltage generating portion at stand-by of the semiconductor memory device. Such a problem can be avoided.

According to another aspect of the present invention, a semiconductor memory device includes a plurality of internal voltage generating circuits which are in an operating state even at stand-by of the semiconductor memory device and which generate internal voltages having different uses required for reading and writing of information, each of the internal voltage generating circuits including an internal voltage generating portion which is in a operating state even at stand-by of the semiconductor memory device, and a first stopping circuit stopping operation of the internal voltage generating portion in response to a predetermined signal.

As described above, without cutting a wire supplying current to the internal voltage generating portion of one of the plurality of internal voltage generating circuits, the internal voltage generating portion can be stopped electrically by the predetermined signal.

Conventionally, by cutting the wire, a substrate is damaged or the cut wire is shorted to an adjacent wire, hampering the measurement of the difference in power consumption of the whole semiconductor memory device at stand-by between before and after the operation of the internal voltage generating portion of one of the internal voltage generating circuits (current consumption of the internal voltage generating portion whose operation is stopped at stand-by of the semiconductor memory device) is stopped. Such a problem can be avoided according to the present invention. More specifically, a value of current consumption of the internal voltage generating portion of a necessary internal voltage generating circuit can be obtained easily at the time of development and improvement of a product.

Since the wire is not cut, the semiconductor memory device can be used many times, making it possible to grasp the characteristics of the semiconductor memory device precisely. More specifically, current consumption can be measured for respective internal voltage generating portions of the plurality of internal voltage generating circuits at stand-by of the semiconductor memory device using the same semiconductor memory device.

Further, the characteristics of the same semiconductor memory device other than the above described current consumption of the internal voltage generating portion can be checked, making it possible to grasp the characteristics of the semiconductor memory device consistently. Since the same semiconductor memory device can be used many times, the cost required for grasping the characteristics of the semiconductor memory device such as the above described current consumption of the internal voltage generating portion can be decreased.

Preferably, the semiconductor memory device further includes a signal generating circuit generating a predetermined signal.

Since the semiconductor memory device includes the signal generating circuit generating a predetermined signal for stopping the internal voltage generating portion of the internal voltage generating circuit internally, the predetermined signal can be generated using internal signals of the semiconductor memory device.

As a result, current consumption can be measured even if the semiconductor memory device is not provided with a pin for input of the predetermined signal.

Preferably, the semiconductor memory device receives the predetermined signal for stopping the internal voltage generating portion from outside the semiconductor memory device.

Since the semiconductor memory device receives the predetermined signal for stopping the internal voltage generating portion of the internal voltage generating circuit from outside the semiconductor memory device, an area of the semiconductor memory device can be saved.

As a result, the degree of integration of the semiconductor memory device can be improved.

Preferably, the semiconductor memory device includes a signal generating circuit generating a predetermined signal when internal signals of the semiconductor memory device transition at a predetermined timing, and when a voltage signal having a predetermined voltage value is input.

As described above, the semiconductor memory device generates the predetermined signal for stopping the internal voltage generating portion using a timing and a voltage value which are not used in original operation of the semiconductor memory device such as reading and writing of information.

As a result, the semiconductor memory device is prevented from entering easily a special mode of measurement of current consumption of the internal voltage generating portion, for which the semiconductor memory device should not be originally used.

According to still another aspect of the present invention, a method of measuring current consumption includes the steps of measuring current consumption at stand-by of a semiconductor memory device, measuring current consumption of the semiconductor memory device after any one of a plurality of internal voltage generating circuits which are in an operating state is stopped by a predetermined electric signal. at stand-by of the semiconductor memory device, and calculating the difference between current consumption of the semiconductor memory device before one of the internal voltage generating circuits is stopped and current consumption of the semiconductor memory device after one of the internal voltage generating circuits is stopped to calculate current consumption of one of the internal voltage generating circuits at stand-by of the semiconductor memory device.

As described above, by measuring current consumption at stand-by of the semiconductor memory device before and after the operation of one of the plurality of internal voltage generating circuits is electrically stopped by the predetermined signal to calculate the difference between them, current consumption of the internal voltage generating circuit whose operation is stopped is calculated.

By cutting a wire for stopping operation of one of the internal voltage generating circuits, a substrate is damaged or the cut wire is shorted to an adjacent wire, hampering measurement of current consumption of one of the internal voltage generating circuits. Such a problem can be avoided according to the present invention. More specifically, current consumption of a required internal voltage generating circuit at stand-by of the semiconductor memory device can be obtained easily at the time of development and improvement of a product.

Since the wire is not cut in the present invention, the same semiconductor memory device can be used many times, making it possible to grasp the characteristics of the semiconductor memory device precisely. More specifically, current consumption can be measured for every one of the plurality of internal voltage generating circuits at stand-by of the semiconductor memory device using the same semiconductor memory device.

Further, the characteristics of the same semiconductor memory device other than the above described current consumption of internal voltage generating circuits can be checked, making it possible to grasp the characteristics of the semiconductor memory device consistently.

Since the same semiconductor memory device can be used many times, the cost required for grasping the characteristics of the semiconductor memory device such as the above described current consumption of internal voltage generating circuits can be decreased.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An internal voltage generating circuit, a semiconductor memory device, and a method of measuring current consumption according to the present invention will be described hereinafter with reference to the drawings.

[First Embodiment]

Figure 1:
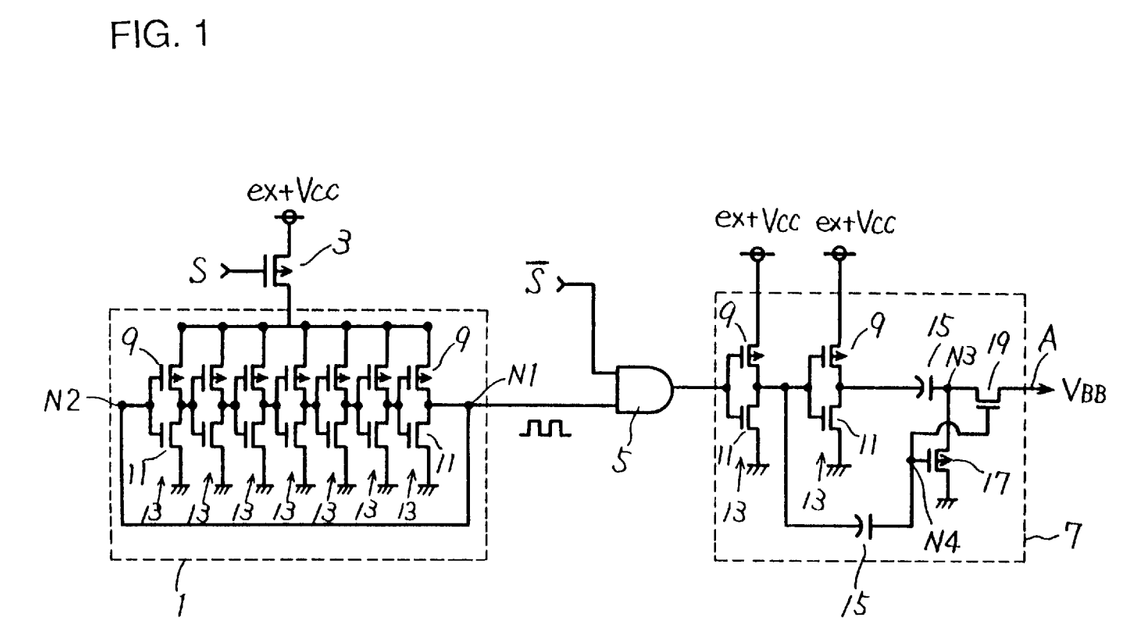
FIG. 1 is a circuit diagram showing the detail of a substrate voltage generating circuit as an internal voltage generating circuit according to a first embodiment of the present invention.

FIG. 1 is a circuit diagram showing the detail of a substrate voltage generating circuit as an internal voltage generating circuit according to the first embodiment of the present invention.

Referring to FIG. 1, the substrate voltage generating circuit according to the first embodiment. includes an oscillator 1, a p channel transistor 3, an AND circuit 5, and a pump circuit 7.

Since oscillator 1 and pump circuit 7 are the same in structure and operation as those of the conventional substrate voltage generating circuit shown in FIG. 8, the description thereof will not be repeated.

In the substrate voltage generating circuit according to the first embodiment, p channel transistor 3 has its drain connected to an external power source and its source connected to terminals on the power source side of an odd number of stages of inverters 13 configuring oscillator 1 in common. When it is intended to stop operation of oscillator 1, a stop signal S at the H level is applied to the gate of p channel transistor 3 to stop supply of the external power supply voltage extVcc to each inverter 13. Simultaneously, a stop signal $\overline{S}$ at the L level is applied to AND circuit 5 in order to stop input from oscillator 1 to pump circuit 7. Oscillator 1 and pump circuit 7 are thus stopped. More specifically, operation of the substrate voltage generating circuit is stopped.

The method of measuring current consumption of the substrate voltage generating circuit at stand-by of the semiconductor memory device according to the first embodiment of the present invention will now be described.

At first, current consumption of the entire semiconductor memory device at stand-by is measured. Note that the semiconductor memory device includes a plurality of internal voltage generating circuits which are in an operating state at stand-by, other than the substrate voltage generating circuit. Then, as described above, the substrate voltage generating circuit is electrically stopped in response to the stop signals S and $\overline{S}$, to measure current consumption of the entire semiconductor memory device at stand-by. Then, the difference in current consumption of the entire semiconductor memory device between before and after the operation of the substrate voltage generating circuit is stopped is calculated. This difference in current consumption indicates current consumed by the substrate voltage generating circuit at stand-by of the semiconductor memory device.

As described above, according to the first embodiment, by stopping the substrate voltage generating circuit in response to a predetermined electric signal without cutting a wire, the amount of current consumed by the substrate voltage generating circuit is measured.

As a result, a problem of being unable to measure current consumption of the substrate voltage generating circuit at stand-by due to damage to a substrate or the like can be eliminated. More specifically, current consumption of the substrate voltage generating circuit can be easily measured at the time of development and improvement of a product.

Further, the wire is not broken in the semiconductor memory device. Therefore, even after current consumption of the substrate voltage generating circuit is measured, current consumption of another internal voltage generating circuit can be measured, or the other characteristics of the semiconductor memory device can be checked using the same semiconductor memory device. In addition, the cost required for checking of the characteristics of the semiconductor memory device such as current consumption can be reduced.

[Second Embodiment]

Figure 2:
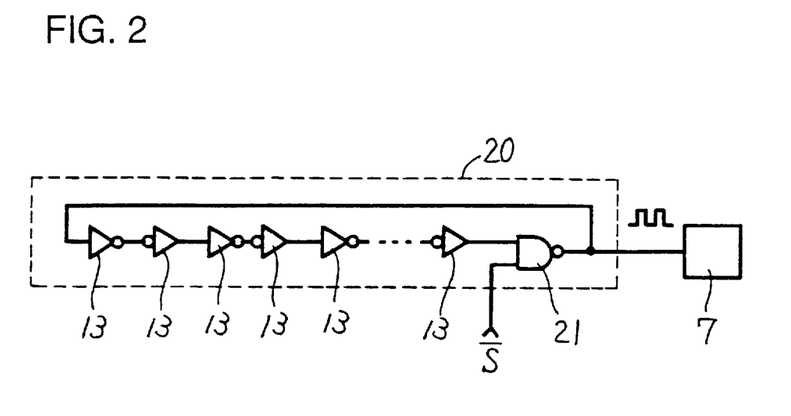
Fig. 2 is a schematic diagram showing a substrate voltage generating circuit as an internal voltage generating circuit according to a second embodiment of the present invention.

FIG. 2 is a schematic diagram showing a substrate voltage generating circuit as an internal voltage generating circuit according to the second embodiment of the present invention.

Referring to FIG. 2, the substrate voltage generating circuit according to the second embodiment includes an oscillator 20 and pump circuit 7. Pump circuit 7 of this embodiment is the same in structure and operation as that of the conventional substrate voltage generating circuit shown in FIG. 8. Oscillator 20 includes an even number of inverters 13 and an NAND circuit 21 connected in series.

In order to stop operation of oscillator 20, the stop signal $\overline{S}$ at the L level is input to NAND circuit 21. In response to the signal, the substrate voltage generating circuit is to be stopped. When current consumption of the substrate voltage generating circuit at stand-by of the semiconductor memory device is found according to the second embodiment, current consumptions of the entire semiconductor memory device at stand-by are measured before and after the operation of the substrate voltage generating circuit is electrically stopped in response to the stop signal $\overline{S}$ as described above, and the difference between them is calculated. This difference corresponds to the amount of current consumed by the substrate voltage generating circuit at stand-by. Note that a plurality of internal voltage generating circuits other than the substrate voltage generating circuit are in an operating state at stand-by of the semiconductor memory device. As described above, according to the second embodiment, current consumption of the substrate voltage generating circuit is measured by stopping the substrate voltage generating circuit in response to a predetermined electric signal without cutting a wire.

As a result, the second embodiment brings about the same effect as the first embodiment.

[Third Embodiment]

Figure 3:
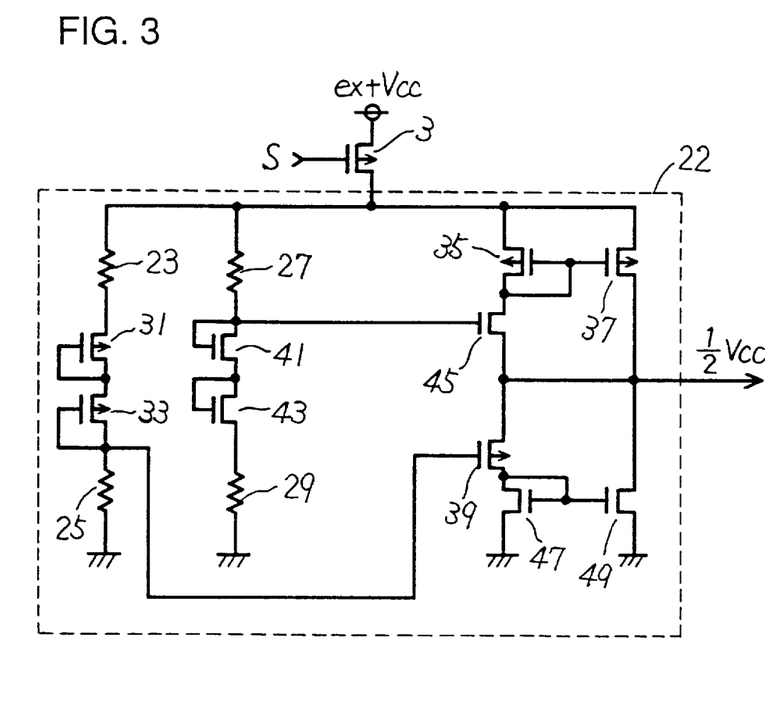
FIG. 3; is a circuit diagram showing the detail of a ½ $V_{CC}$ generating circuit as an internal voltage generating circuit according to a third embodiment of the present invention.

FIG. 3 is a circuit diagram showing the detail of a ½ $V_{CC}$ generating circuit as an internal voltage generating circuit according to the third embodiment of the present invention.

Referring to FIG. 3, the ½ $V_{CC}$ generating circuit according to the third embodiment includes p channel transistor 3 and a ½ $V_{CC}$ generating unit 22. Since ½ $V_{CC}$ generating unit 22 is the same as the conventional ½ $V_{CC}$ generating circuit shown in FIG. 9 in structure and operation, the description thereof will not be repeated.

In the ½ $V_{CC}$ generating circuit, p channel transistor 3 has its drain connected to an external power source, and its source connected to a terminal of ½ $V_{CC}$ generating unit 22 on the power source side. In order to stop operation of ½ $V_{CC}$ generating unit 22, the stop signal S at the H level is applied to the gate of p channel transistor 3, to stop supply of the external power supply voltage extVcc to ½ $V_{CC}$ generating unit 22. This suppresses operation of the ½ $V_{CC}$ generating circuit.

Here, in order to find current consumption of the ½ $V_{CC}$ generating circuit at stand-by of the semiconductor memory device according to the third embodiment, current consumptions of the whole semiconductor memory device at stand-by before and after the operation of ½ $V_{CC}$ generating unit 22 is electrically stopped in response to the stop signal S are measured as described above, and the difference between them is calculated. This difference corresponds to current consumption of the ½ $V_{CC}$ generating circuit of the semiconductor memory device at stand-by. Note that, at stand-by of the semiconductor memory device, a plurality of internal voltage generating circuits other than the ½ $V_{CC}$ generating circuit are in an operating state.

As described above, in the third embodiment, without cutting a wire, the ½ $V_{CC}$ generating circuit is stopped in response to a predetermined electric signal to measure current consumption of the ½ $V_{CC}$ generating circuit.

As a result, the third embodiment brings about the same effect as the first embodiment.

[Fourth Embodiment]

Figure 4:
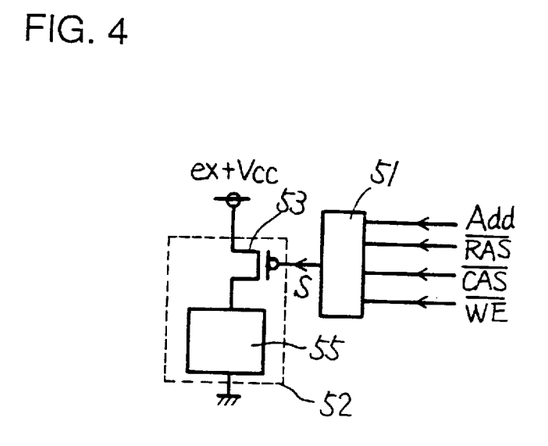
FIG. 4 is a schematic block diagram showing an internal voltage generating portion of a semiconductor memory device according to a fourth embodiment of the present invention.

FIG. 4 is a schematic block diagram showing an internal voltage generating portion of the semiconductor memory device according to the fourth embodiment of the present invention.

Referring to FIG. 4, the internal voltage generating portion of the semiconductor memory device includes a stop signal generating circuit 51 and an internal voltage generating circuit 52. Internal voltage generating circuit 52 includes a p channel transistor 53 and an internal voltage generating unit 55.

The drain of p channel transistor 53 is connected to an external power source, and the source of p channel transistor 53 is connected to a terminal of internal voltage generating unit 55 on the power source side. The p channel transistor 53 receives a signal from stop signal generating circuit 51 at its gate. In order to stop operation of internal voltage generating unit 55, the signal S at the H level is applied to the gate of p channel transistor 53 from stop signal generating circuit 51 to stop supply of voltage to internal voltage generating unit 55. This suppresses operation of internal voltage generating circuit 52.

Internal voltage generating unit 55 is a circuit for generating a predetermined voltage in the semiconductor memory device, which corresponds to substrate voltage generating circuit 73, internal power supply voltage generating circuit 75, ½ $V_{CC}$ generating circuit 77, or boost voltage generating circuit 79 shown in FIG. 7.

Although all of them are not shown in FIG. 4, the semiconductor memory device includes a plurality of internal voltage generating circuits 52 each including p channel transistor 53 and internal voltage generating unit 55 having a different use as described.

As the plurality of internal voltage generating circuits 52, there are, for example, a first internal voltage generating circuit formed of a substrate voltage generating unit corresponding to substrate voltage generating circuit 73 shown in FIG. 7 and a p channel transistor, a second internal voltage generating circuit formed of an internal power supply voltage generating unit corresponding to internal power supply voltage generating unit 75 shown in FIG. 7 and a p channel transistor, a third internal voltage generating circuit formed of a ½ $V_{CC}$ generating unit corresponding to ½ $V_{CC}$ generating circuit 77 shown in FIG. 7 and a p channel transistor, and a fourth internal voltage generating circuit formed of a boost voltage generating unit corresponding to boost voltage generating circuit 79 shown in FIG. 7 and a p channel transistor.

In order to stop operation of a particular internal voltage generating circuit 52, the stop signal S at the H level is applied to the gate of the p channel transistor of internal voltage generating circuit 52 to be stopped.

A method will be described of measuring current consumption of one of the above described plurality of internal voltage generating circuits 52 at stand-by of the semiconductor memory device according to the fourth embodiment.

The p channel transistor 53 of internal voltage generating circuit 52 whose current consumption is to be measured is turned off in response to the stop signal S from stop signal generating circuit 51, whereby current consumptions of the whole semiconductor memory device at stand-by are measured before and after internal voltage generating circuit 52 is stopped. Then, the difference between them is calculated. This difference corresponds to current consumption of the internal voltage generating circuit whose operation is stopped at stand-by of the semiconductor memory device. Current consumptions of the other internal voltage generating circuits are found with the similar method.

Figure 5:
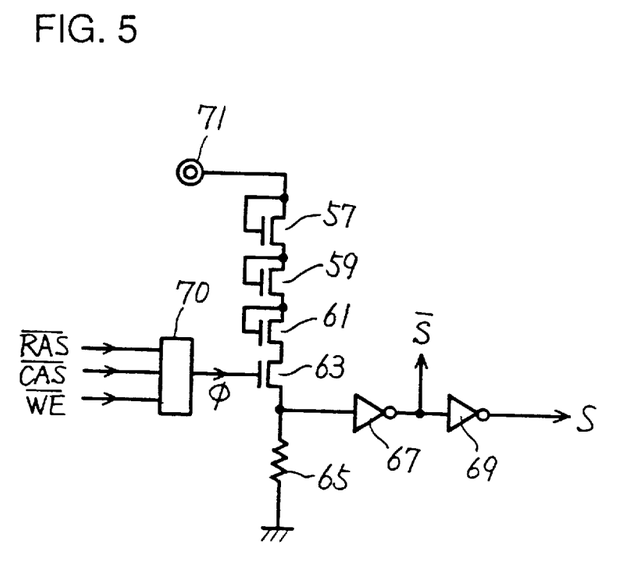
FIG. 5 is a circuit diagram showing the detail of a stop signal generating circuit of FIG. 4 according to the fourth embodiment of the present invention.

FIG. 5 is a circuit diagram showing the detail of stop signal generating circuit 51 of FIG. 4.

Referring to FIG. 5, the stop signal generating circuit includes diode-connected n channel transistors 57, 59, and 61, an n channel transistor 63 receiving a signal φ at its gate, a resistor 65, inverters 67 and 69, and a φ generating circuit 70.

When a voltage superV$_{iH}$ at the higher H level obtained by boosting a voltage used during normal operation of the semiconductor memory device by a boost circuit (not shown) is input through an address pin 71, and when the signal φ at the H level is applied to the gate of n channel transistor 63 from φ generating circuit 70, the stop signal generating circuit generates the stop signal $\overline{S}$ at the L level and the stop signal S at the H level.

Note that the signal φ attains the H level only when the signals in the semiconductor memory device (the row address strobe signal $\overline{RAS}$, the column address strobe signal $\overline{CAS}$, and the signal $\overline{WE}$ controlling reading and writing of data) transition at a predetermined timing. The signal φ is generated from φ generating circuit 70.

Figure 6:
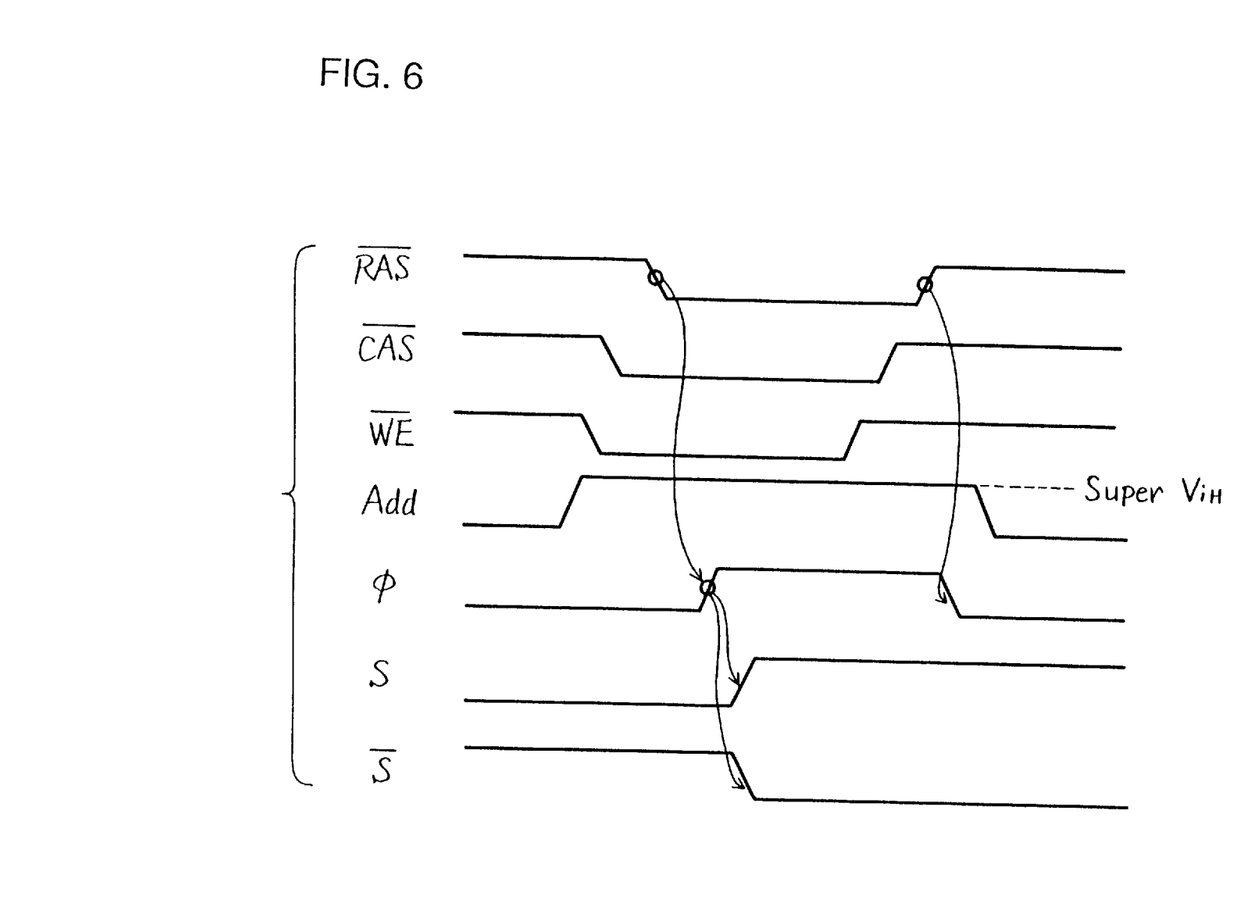
FIG. 6 is a timing chart showing operation of the stop signal generating circuit of FIG. 5 according to the fourth embodiment of the present invention.

FIG. 6 is a timing chart showing operation of the stop signal generating circuit of FIG. 5.

Referring to FIG. 6, the signal φ of FIG. 5 attains the H level only when the row address strobe signal $\overline{RAS}$ falls later than the column address strobe signal $\overline{CAS}$, and when the column address strobe signal $\overline{CAS}$ falls later than the signal $\overline{WE}$ controlling reading and writing of data.

The signal φ at the H level turns on n channel transistor 63. Further, when the high voltage superV$_{iH}$ which is not used during the normal operation of the semiconductor memory device is applied from the boost circuit, not shown, through address pin 71 of FIG. 5, the stop signal generating circuit of FIG. 5 generates the stop signal S at the H level and the stop signal $\overline{S}$ at the L level as shown in FIG. 6.

Note that the high voltage superV$_{iH}$ which is not used during the normal operation of the semiconductor memory device is 8 V, when the voltage which is normally used is 6.5 V, for example.

Further, the signal φ is pulled down when the signal $\overline{RAS}$ rises as shown in FIG. 6, to turn off n channel transistor 63.

The stop signal S at the H level is used when the circuit is stopped by input at the H level, such as, when internal voltage generating unit 55 of internal voltage generating circuit 52 is stopped in this embodiment.

The stop signal $\overline{S}$ at the L level is used in order to stop the circuit by input at the L level. The stop signal $\overline{S}$ at the L level is used as the stop signal $\overline{S}$ S input to AND circuit 5 in order to stop output of oscillator 1 of the substrate voltage generating circuit according to the first embodiment, for example.

As described above, in the fourth embodiment, by stopping internal voltage generating circuit 52 in response to a predetermined electric signal without cutting a wire, current consumption of internal voltage generating circuit 52 at stand-by of the semiconductor memory device is measured.

As a result, this embodiment brings about the same effect as the first embodiment.

Further, the semiconductor memory device according to the fourth embodiment includes stop signal generating circuit 51 internally. Therefore, a stop signal for stopping internal voltage generating circuit 52 can be generated using internal signals of the semiconductor memory device.

As a result, current consumption can be measured even if the semiconductor memory device is not provided with a pin for input of a predetermined signal.

Further, the stop signal generating circuit of the fourth embodiment generates the stop signals S and S only when the signal φ which attains the H level when the internal signals of the semiconductor memory device transition at a predetermined timing and the predetermined high voltage superV$_{iH}$ are input.

As a result, in the fourth embodiment, the semiconductor memory device is prevented from easily entering a special mode of measurement of current consumption of internal voltage generating circuit 52, in which the semiconductor memory device should not be used originally.

In the fourth embodiment, the semiconductor memory device includes the stop signal generating circuit. However, the semiconductor memory device does not have to include the stop signal generating circuit inside. The n channel transistor 53 of FIG. 4 can be stopped in response to an externally applied stop signal.

Also in this case, the fourth embodiment brings about the same effect as the first embodiment. Further, since the stop signal generating circuit is not included inside, an area of the semiconductor memory device can be saved, whereby the degree of integration can be improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising a plurality of internal voltage generating circuits each generating a different internal voltage required by said semiconductor device for different operational functions, wherein each of said internal voltage generating circuits includes internal voltage generating means for generating the respective different internal voltage, and first stopping means responsive to a predetermined signal, other than a signal corresponding to said respective different internal voltage generated by the internal voltage generating means, for stopping operation of said internal voltage generating means.

2. The semiconductor device according to claim 1, further comprising signal generating means for generating said predetermined signal.

3. The semiconductor device according to claim 1, wherein said predetermined signal is a signal from outside said semiconductor device.

4. The semiconductor device according to claim 2, wherein said signal generating means generates said predetermined signal when an internal signal of said semiconductor device transitions at a predetermined timing and when a voltage signal having a predetermined voltage value is input.

5. The semiconductor device according to claim 1, wherein said internal voltage generating means includes oscillating means for generating a pulse signal, and pumping means for generating a negative voltage as said internal voltage by a pumping operation according to said pulse signal, and said first stopping means includes second stopping means for stopping said oscillating means, and third stopping means for stopping said pumping means.

6. The semiconductor device according to claim 5, wherein said internal voltage generating means applies said negative voltage to a substrate of a transistor of said semiconductor device.

7. The semiconductor device according to claim 1, wherein said internal voltage generating means includes oscillating means for generating a pulse signal, and pumping means for generating a negative voltage as said internal voltage by a pumping operation according to said pulse signal, said oscillating means being stopped by said first stopping means in response to said predetermined signal, and said pumping means being also stopped in response to the stop of said oscillating means.

8. The semiconductor device according to claim 7, wherein said internal voltage generating means applies said negative voltage to a substrate of a transistor of said semiconductor device.

9. The semiconductor device according to claim 1, wherein said internal voltage generating means generates a voltage one-half power supply voltage of said semiconductor device as said internal voltage, and said first stopping means stops supply of said power supply voltage to said internal voltage generating means in response to said predetermined signal.

10. The internal voltage generating circuit according to claim 1, wherein the semiconductor device is a semiconductor memory device.

11. The semiconductor device according to claim 10, wherein said internal voltage generating means generates a cell plate voltage of a memory cell of said semiconductor memory device as said internal voltage.

12. A method of measuring current consumption of any one of a plurality of internal voltage generating circuits which are in an operating state even at stand-by of a semiconductor memory device and which generate internal voltages having different uses required for reading and writing of information of said semiconductor memory device at stand-by of said semiconductor memory device, comprising the steps of:

measuring current consumption at stand-by of said semiconductor memory device;

measuring current consumption of said semiconductor memory device after stopping any one of said plurality of internal voltage generating circuits which are in an operating state in response to a predetermined signal at stand-by of said semiconductor memory device; and calculating a difference between current consumption of said semiconductor memory device before one of said internal voltage generating circuits is stopped and current consumption of said semiconductor memory device after one of said internal voltage generating circuits is stopped to find current consumption of one of said internal voltage generating circuits at stand-by of said semiconductor memory device.

13. An internal voltage generating circuit generating an internal voltage of a semiconductor memory device, comprising:

internal voltage generating means which is in an operating state even at stand-by of said semiconductor memory device;

stop signal generating means, responsive to high voltage applied to a predetermined address pin of said semiconductor memory device and to predetermined control signals of said semiconductor memory device changing signal levels at a predetermined timing, for generating a stop signal; and stopping means responsive to said stop signal for stopping operation of said internal voltage generating means.

* * * * *